United States Patent
Armstrong

[19]

[11] Patent Number: 6,113,056
[45] Date of Patent: Sep. 5, 2000

[54] WORKPIECE VIBRATION DAMPER

[75] Inventor: Allen Armstrong, Lexington, Mass.

[73] Assignee: Micrion Corporation, Peabody, Mass.

[21] Appl. No.: 09/129,451

[22] Filed: Aug. 4, 1998

[51] Int. Cl.$^7$ .................................................. F16M 13/00
[52] U.S. Cl. ........................................................... 248/562
[58] Field of Search .................................... 248/562, 569,
248/636, 638; 267/214, 287, 210; 269/287

[56] References Cited

U.S. PATENT DOCUMENTS

| | | | |
|---|---|---|---|
| 2,475,302 | 7/1949 | Adams | 248/569 |
| 2,617,697 | 11/1952 | Blattner | 267/214 X |
| 3,708,851 | 1/1973 | Vladik | 269/287 X |
| 3,952,980 | 4/1976 | Von Pragenau et al. | 248/636 |
| 4,040,590 | 8/1977 | Baratoff | 248/569 |
| 4,371,141 | 2/1983 | Baratoff | 248/569 |
| 4,438,599 | 3/1984 | Kamman et al. . | |
| 4,648,725 | 3/1987 | Takahashi | 384/9 |
| 4,815,214 | 3/1989 | Enderle | 33/832 |
| 4,952,858 | 8/1990 | Galburt . | |
| 5,105,147 | 4/1992 | Karasikov et al. . | |
| 5,109,177 | 4/1992 | Grellmann et al. . | |
| 5,155,523 | 10/1992 | Hara et al. . | |
| 5,508,518 | 4/1996 | Kendall . | |
| 5,735,511 | 4/1998 | Stocker et al. | 248/569 X |
| 5,875,828 | 3/1999 | Quiram et al. | 248/678 X |

FOREIGN PATENT DOCUMENTS

| | | |
|---|---|---|
| 0929209A2 | 7/1999 | European Pat. Off. . |
| 7-201298 | 8/1995 | Japan . |

*Primary Examiner*—Ramon O. Ramirez
*Assistant Examiner*—Anita M. King
*Attorney, Agent, or Firm*—W. Hugo Liepmann; Foley, Hoag & Eliot LLP

[57] ABSTRACT

The present invention provides an apparatus for supporting a workpiece in a precision processing system. The apparatus includes a plurality of workpiece contact elements for supporting the workpiece substantially in a plane, and a compliant stiction support for reducing workpiece vibration. The workpiece supporting apparatus can include a base member connected to the workpiece contact elements and to the compliant stiction support. The complaint stiction support can include a slider assembly for contacting the workpiece. The slider assembly is in sliding, frictional connection with the base member. The compliant stiction support can further include a workpiece contact spring element for forcing the slider assembly into contact with the workpiece. The compliant stiction support can further include a stiction spring element. The stiction spring element is in contact with the slider element. The stiction spring element forces the slider element into frictional contact with the base member. Thus, the compliant stiction support stiffly supports the workpiece against vibrational forces.

15 Claims, 6 Drawing Sheets

WORKPIECE VIBRATION DAMPER

BACKGROUND

This invention relates to apparatus for supporting a workpiece, e.g., a semiconductor wafer, in a precision processing system, such as a focused ion beam system or an electron microscope system. Focused ion beam (FIB) systems can both image and etch, e.g., micromachine, a workpiece. Existing FIB systems commonly support a workpiece on fixed, rigid workpiece contact elements.

Unless firmly clamped, workpieces such as wafers held in an FIB machine or electron microscope tend to vibrate in the spans between the rigid workpiece contact elements. This is a particular problem in the acoustic environment of wafer fabrication plants. Wafer vibration can cause image degradation or produce defects during micromachining.

In addition, wafers are often somewhat curved. Having a curved wafer increases focusing problems for a precision processing system. Under atmospheric conditions, a precision processing system can firmly clamp a wafer by drawing a partial vacuum underneath the wafer. The reduced pressure pulls the wafer into contact with a backing plate, with atmospheric pressure acting over the entire wafer surface. Firm clamping via partial vacuum reduces wafer curvature, as the wafer contacts the backing plate in numerous locations. Further, the largest unsupported span of the wafer is short and possible vibration frequencies for the wafer are high.

Often precision processing systems, such as an FIB system, place a wafer in a vacuum for processing. In vacuum, the above-described partial vacuum clamping method is not available. Precision processing systems can use electrostatic forces as a substitute for the partial vacuum clamp. As with a partial vacuum clamp, electrostatic forces can act over the entire wafer surface. However, there are significant disadvantages. The equipment to achieve such electrostatic forces is expensive and generally does not produce forces of high magnitude. High voltage breakdown can occur and damage the wafer. The resulting electrostatic field can undesirably deflect the ion or electron beam. In addition, a system using electrostatic forces can have difficulty releasing the wafer when the source for generating the electrostatic forces is turned off.

Precision processing systems can apply mechanical clamping as a substitute for electrostatic forces. However, applying mechanical clamping to the wafer surface anywhere but at the edge of the wafer can occlude and damage the work area. In addition, mechanical clamping at the edge of the wafer does not ensure that the wafer, which is usually somewhat curved or otherwise not absolutely planar, will contact a substantially flat backing plate anywhere except at the edges or other fragmentary portions of the wafer. The backing plate can be designed with a greater curvature than the largest curvature possible in a wafer. However, having a curved backing plate and a correspondingly curved wafer increases focusing problems for a precision processing instrument.

It is an object of the invention to provide apparatus for supporting a workpiece in a precision FIB system.

It is another object of the invention to provide workpiece supporting apparatus that reduces workpiece vibration.

It is another object of the invention to provide workpiece supporting apparatus that is relatively easy and inexpensive to manufacture and to repair.

It is another object of the invention to provide workpiece supporting apparatus that operates effectively in a vacuum.

Other objects of the invention will in part be obvious and will in part appear hereinafter.

SUMMARY OF THE INVENTION

Apparatus according to this invention supports a workpiece in a precision processing instrument, e.g., in an FIB system or in an electron microscope system. In one preferred embodiment, a workpiece supporting apparatus includes a plurality of workpiece contact elements and a compliant stiction support carried on a base member. The workpiece contact elements maintain the workpiece substantially in a plane. The compliant stiction support stiffly supports the workpiece against vibrational forces and thus reduces vibration of the workpiece.

When a workpiece is placed on the workpiece contact elements and the compliant stiction support, the stiction support is depressed under the weight of the workpiece. Once the stiction support comes to rest, after being depressed by the workpiece, the stiction support must overcome static friction in order to move again. The compliant stiction support is located substantially in the plane formed by the workpiece contact elements.

A compliant stiction support, according to one embodiment of the invention, includes a slider assembly for contacting the workpiece. The slider assembly is in sliding, frictional connection with the base member. For example, in one embodiment, the slider assembly is slidably mounted in a slider containing cavity in the base member. According to this embodiment, the compliant stiction support has a workpiece contact spring element between the slider assembly and the bottom of the slider containing cavity in the base member. The workpiece contact spring element resiliently urges the slider assembly into contact with the workpiece. When the slider assembly, under the weight of the workpiece, compresses the workpiece contact spring element, the spring element provides a force not greater than the force necessary to support the weight of the workpiece. Thus, a portion of the weight of the workpiece is carried by the workpiece contact elements. In a preferred embodiment, the compressed workpiece contact spring element provides a force sufficient to support approximately half the weight of the workpiece while the workpiece is concurrently supported by the workpiece contact elements. This preferred embodiment ensures contact of the workpiece with the workpiece contact elements.

The compliant stiction support can further include a stiction spring element for forcing the slider element into frictional contact with the base member. In one embodiment, the stiction spring element is in contact with the base member and the slider element. The stiction spring element forces the slider element into frictional contact with the base member. In a preferred embodiment, the stiction spring element in operation provides a force on the slider element substantially equal to the force provided by the compressed workpiece contact spring element on the slider assembly. The slider element and the base member have a coefficient of static friction preferably between 0.1 and 0.7 and most preferably between 0.2 and 0.6. In an alternative embodiment, apparatus according to the invention can include a plurality of compliant stiction supports.

One preferred embodiment of the invention contemplates a stage having a plurality of rigid workpiece contact elements located near the edges of the workpiece and a compliant stiction support located between the rigid workpiece contact elements. The compliant stiction support has a slider at least partially contained by a slider-containing cavity in the base member. A workpiece contact spring is located between the bottom of the slider and the bottom of the slider-containing cavity. The slider has a stiction spring-containing cavity with an opening facing the side wall of the slider-containing cavity. A stiction spring is at least partially contained in the stiction spring-containing cavity in the slider.

Thus, when a workpiece is placed on the rigid workpiece contact elements, it contacts the slider of the compliant stiction support and depresses the workpiece contact spring. The slider moves downward in contact with the workpiece. The stiction spring element pushes the slider against the surface of the slider-containing cavity, resulting in friction between the slider and the surface of the slider-containing cavity. The friction between the slider and the surface of the slider-containing cavity reduces the vibration of the slider and the portion of the workpiece supported by the slider.

These and other features of the invention are more fully set forth with reference to the following detailed description, and the accompanying drawings.

DESCRIPTION OF ILLUSTRATED EMBODIMENTS

Figure 1:
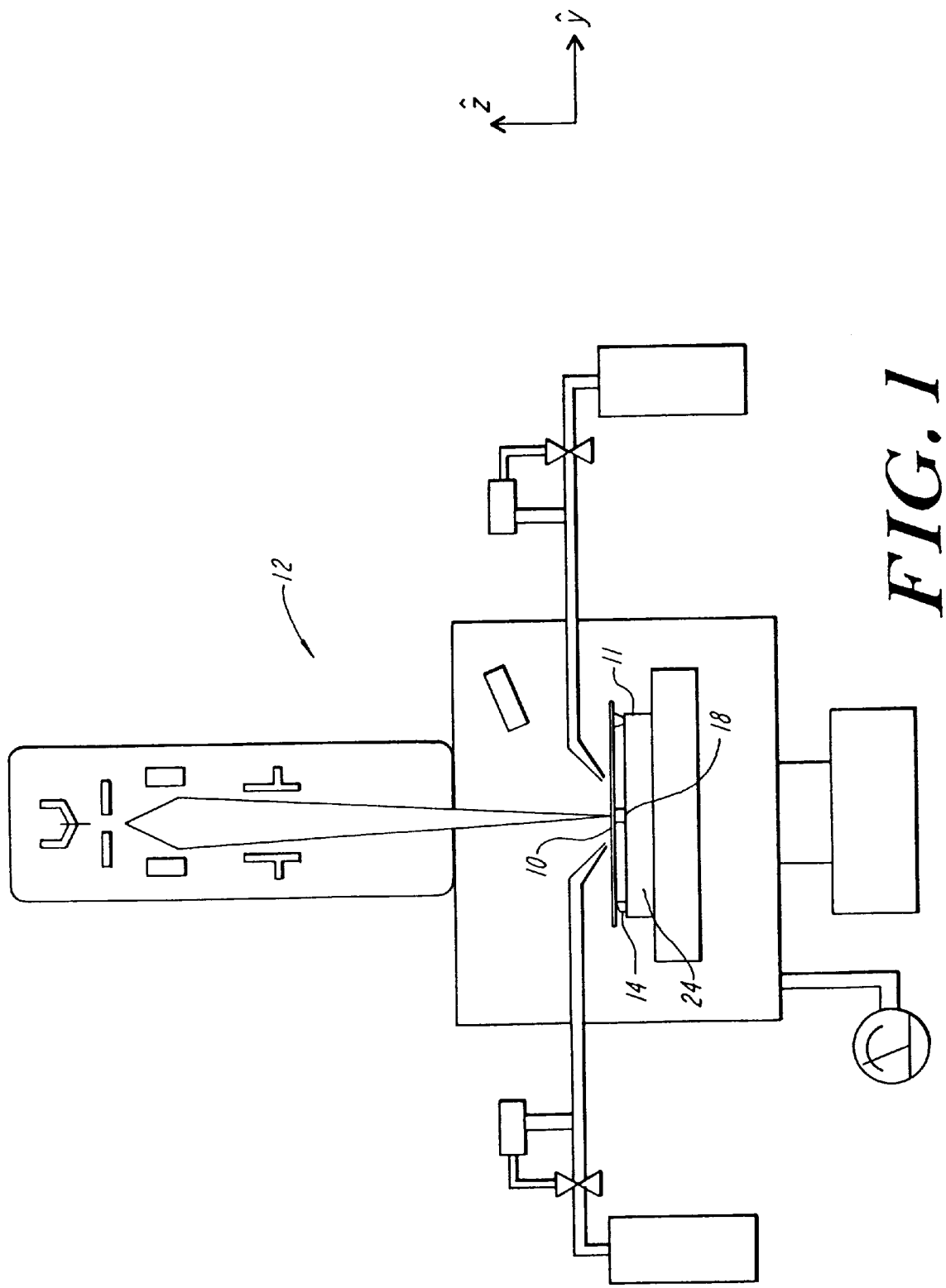
FIG. 1 is a schematic representation of a focused ion beam system including apparatus for supporting a workpiece according to the present invention.
Figure 2:
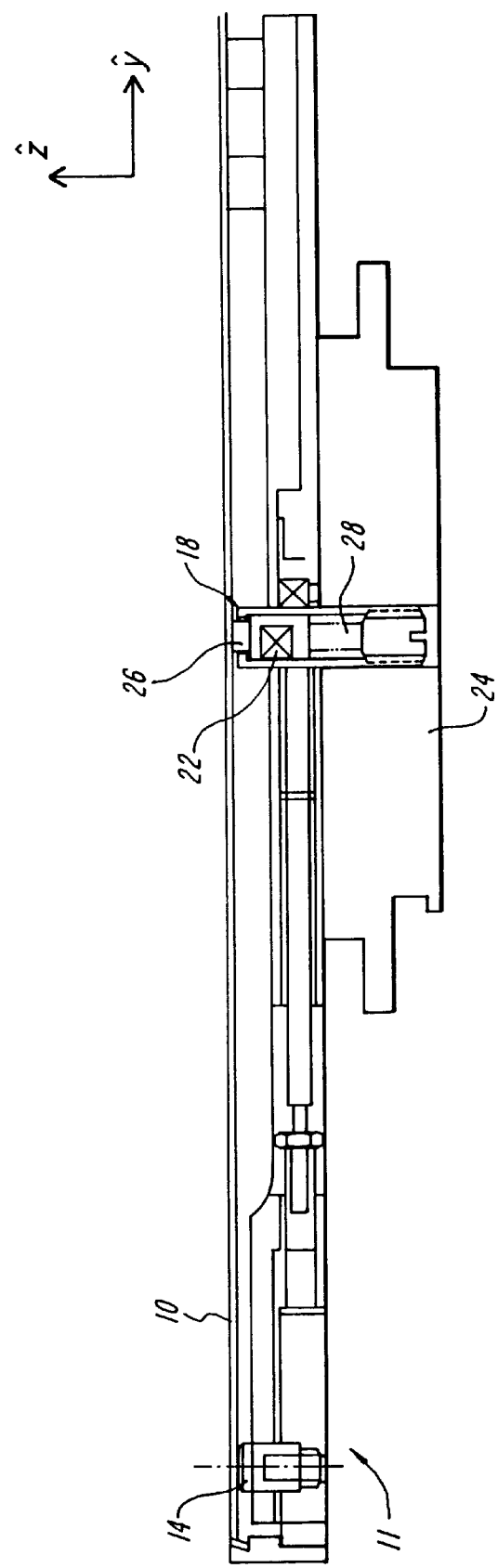
FIG. 2 is cross-sectional view of a portion of the apparatus for supporting a workpiece shown in FIG. 1.
Figure 3:
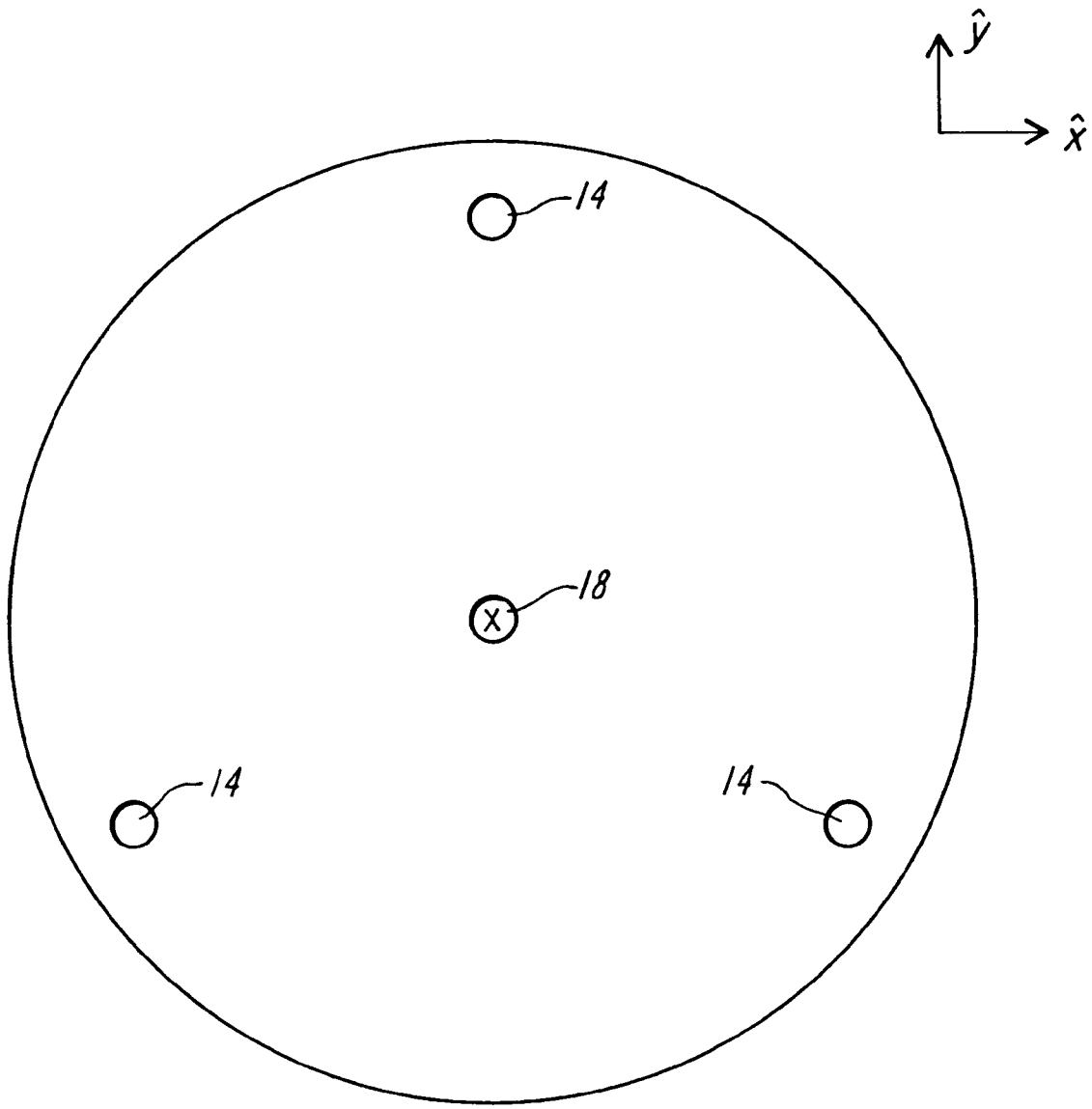
FIG. 3 is a top plan view of a portion of the apparatus for supporting a workpiece shown in FIG. 1.
Figure 4:
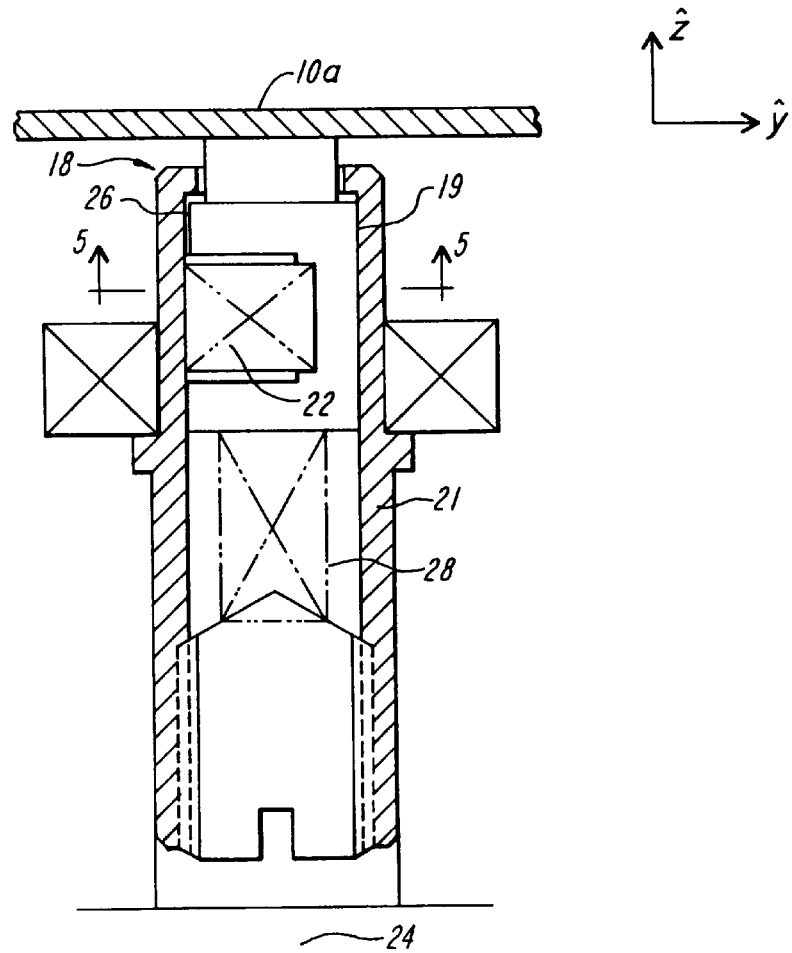
FIG. 4 is cross-sectional view of a compliant stiction support of the workpiece supporting apparatus shown in FIG. 1.
Figure 5:
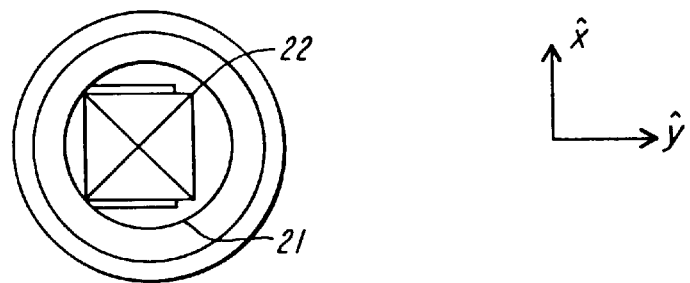
FIG. 5 is a cross-sectional view of a stiction assembly of the compliant stiction support of FIG. 4 shown along line 5—5.
Figure 7:
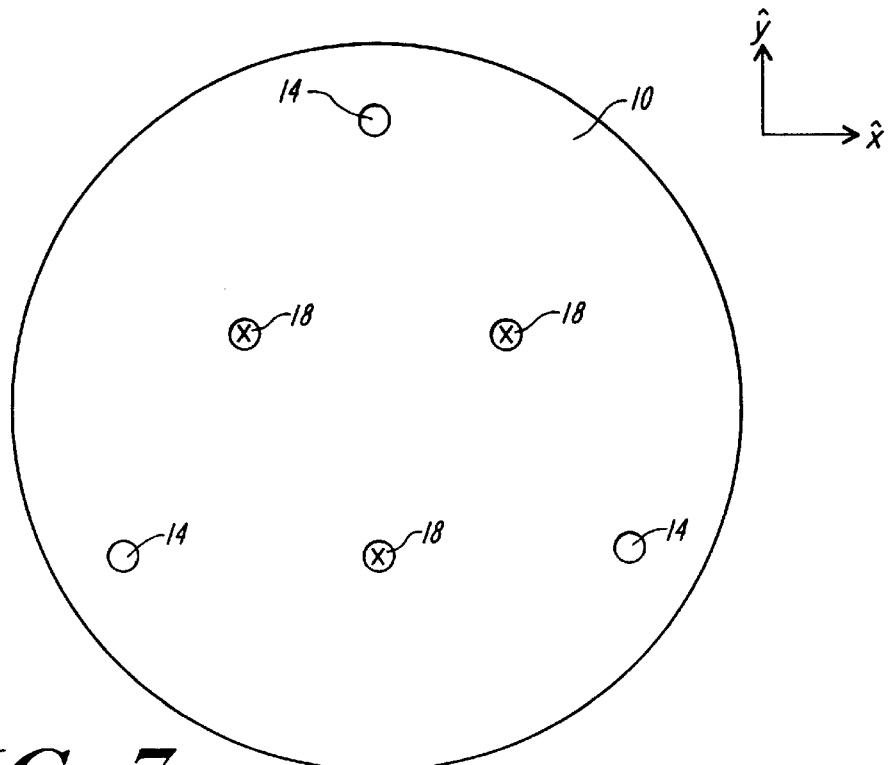
FIG. 7 is a top plan view of an alternative embodiment of a portion of the workpiece supporting apparatus shown in FIG. 1.

FIG. 1 shows apparatus 11 for supporting a workpiece 10 in one type of precision processing system, i.e., an FIB system 12. U.S. Pat. No. 4,874,947, issued to Ward et al. and incorporated herein by reference, contains a more detailed description of an FIB system. FIGS. 2 and 3 are views of a portion of the apparatus 11 for supporting a workpiece 10 shown in FIG. 1. In FIGS. 1–3, the apparatus 11 includes a single compliant stiction support 18 engaging the middle of a workpiece that is also held lightly, by contact elements 14, near its edges. FIGS. 4 and 5 are views of at least a portion of the compliant stiction support 18 shown in FIGS. 1–3. Additional compliant stiction supports can be employed for larger workpieces as illustrated in FIG. 7. As illustrated in FIGS. 1–4, and 5, the workpiece 10 is supported substantially in a horizontal plane, i.e., the plane defined by the indicated X and Y axis. However, the apparatus according to the present invention is not limited to supporting the workpiece in a horizontal plane. For example, a precision processing system with a tilting stage can incorporate the present invention.

With reference to FIGS. 2, 4 and 5, the illustrated compliant stiction support 18 stiffly supports a workpiece 10 against vibrational forces relative to the base member 24. When a precision processing system or a user places a workpiece 10 on workpiece contact elements 14, the workpiece depresses a slider element 26 of the compliant stiction support 18. The illustrated base member 24, as shown in FIGS. 1 and 2, mounts the workpiece contact elements 14 and the stiction support 18. The slider element, in turn, compresses a light workpiece contact spring element 28. When compressed, the spring element 28 preferably provides a force sufficient to support half the weight of the workpiece.

A stiction spring element 22 pushes the slider element 26 against the (grounded) stiction surface 19 of its containing cavity 21, causing a static friction ("stiction") lock to ground for the portion on the workpiece 10a supported by the compliant stiction support 18. The coefficient of static friction between the stiction surface 19 and the slider element 26 is less than approximately 0.5. The force in the stiction spring element 22 is approximately equal to the force provided by the compressed wafer contact spring element 28. With the above-described configuration, the compliant stiction support 18 supports the workpiece while concurrently reducing relatively small magnitude vibration of the workpiece.

The maximum stiction force of the illustrated stiction support 18 is preferably between 1% and 20%, and most preferably is between 5% and 15% of the weight of the workpiece. A stiction force in the above-described ranges reduces relatively high frequency vibrations while allowing the stiction support to remain compliant to the weight of the workpiece. For example, the exciting vibrations encountered in a wafer fabrication environment are on the order of 0.1% of the weight of a wafer. Therefore, the above-described maximum stiction force is more than sufficient to immobilize a portion of a wafer.

Figure 6A:
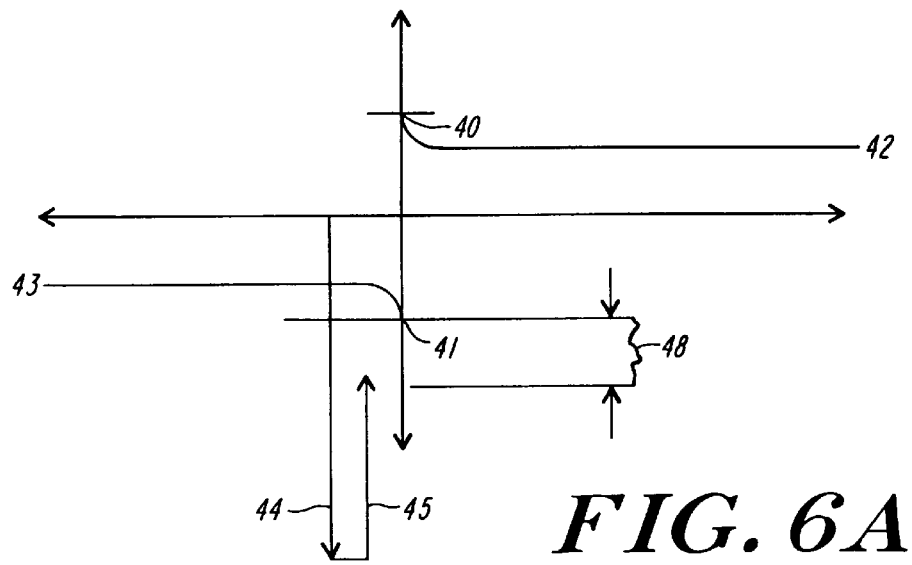
FIGS. 6A–6C are graphical representations of the relationship between the forces acting on, and the velocity of, the slider of the compliant stiction support of FIGS. 1 and 2.
Figure 6B:
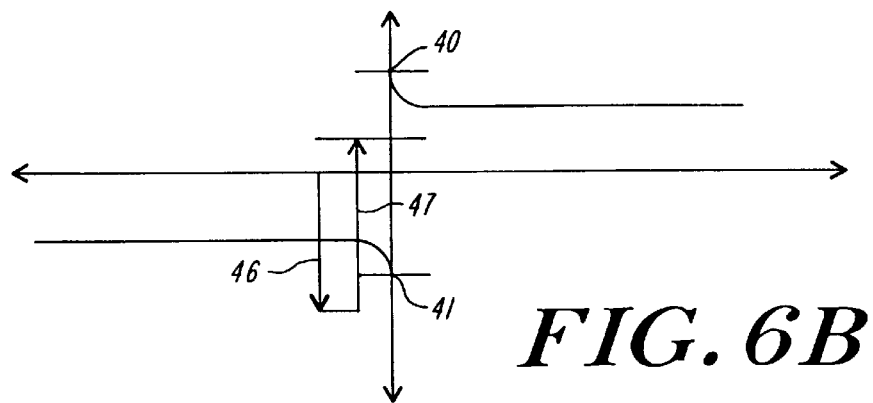
Figure 6C:
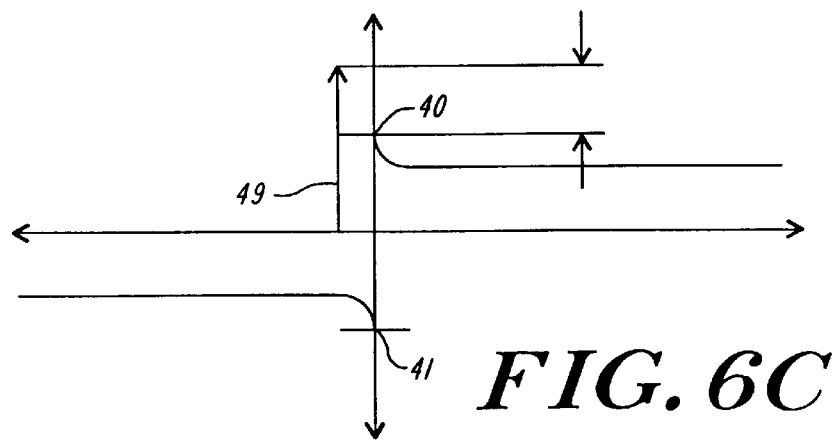

FIGS. 6A–6C illustrates the relationship between the forces acting on, and the velocity of, the slider of the complaint stiction support 18. The non-frictional forces include forces provided by the weight of the workpiece 10 and by the contact spring element 28. The vibrational forces can have a variety of sources including fans located near the apparatus 11.

As illustrated in FIGS. 6A–6C, and on page 290 of J. P. DenHartog's Mechanical Vibrations, 1956, McGraw-Hill, incorporated herein by reference, in dry friction, rubbing elements remain fixed (zero relative velocity) until the driving force reaches a "maximum stiction force" 40, 41 at which point relative motion begins, and the friction force falls to a value 42, 43 that is independent of velocity.

When a workpiece 10 is loaded, as illustrated in FIG. 6A, the force provided by the workpiece's weight, represented by arrow 44, minus the force provided by the contact spring, represented by arrow 45, is greater 48 than the maximum stiction force, represented by point 41, and the workpiece 10 compresses the contact spring element 28. The workpiece 10 comes to rest on the workpiece contact elements 14, which support a fraction of the workpiece's weight. The situation in which the workpiece is supported by the workpiece contact elements 14 and the compliant stiction support 18 is illustrated in FIG. 6B. The fraction of the weight carried by the stiction support provides a force, represented by arrow 46, on the stiction support 18. In the situation illustrated in FIG. 6B, the force 46 minus the contact spring force, represented by arrow 47, is insufficient to overcome static friction and the workpiece is supported with the slider remaining motionless.

In FIG. 6C, the workpiece weight is removed, and the contact spring force, represented by arrow 45, overcomes static friction to move the slider element upward. The maximum force of static friction is determined by the force provided by the stiction spring element 22 and the coefficient of static friction between the slider element 26 and the stiction surface 19 of the containing cavity 21.

Once the slider element 26 comes to rest after being compressed by the workpiece, the slider element will not vibrate normal to the plane of the workpiece, unless vibrational forces in combination with the contact spring force exceed the maximum force of static friction. To the extent that the workpiece remains in contact with the slider element, when the slider element does not vibrate the portion of the workpiece supported by the slider element will not vibrate.

FIG. 7 is a top plan view of an alternative embodiment of a workpiece supporting apparatus according to the present invention including more than one compliant stiction support 18. The compliant stiction supports 18 are substantially within the plane formed by the workpiece contact elements 14. In other words, in one embodiment, the workpiece contact elements 14 form a substantially horizontal plane.

The invention, according to a preferred embodiment, locates the supports 18 to most effectively reduce workpiece vibration. One embodiment of the invention locates the supports 18 in the middle of the larger unsupported spans of the workpiece 10. When a precision processing system uses a plurality of compliant stiction supports, the aggregate force provided by the compressed workpiece contact spring elements preferably does not substantially exceed the force necessary to support half the weight of the workpiece. As many compliant stiction supports 18 can be fitted to a workpiece supporting apparatus as are necessary to reduce movement of the unsupported spans between the workpiece contact elements 14, and thus to limit the resonant frequencies of the wafer vibration modes.

Preferably, the workpiece contact elements 14 in aggregate support at least a quarter of the weight of the workpiece and the stiction supports 18 in aggregate support at least a quarter of the weight of the workpiece. Most preferably, the workpiece contact elements 14 in aggregate support approximately half the weight of the workpiece and the stiction supports 18 in aggregate support approximately half the weight. If the contact elements 14 support to o much of the weight of the workpiece, the workpiece can be susceptible to high frequency vibration. If the stiction supports 18 support too much of the weight of the workpiece, the workpiece as a whole could move in response to disturbances.

Figure 8:
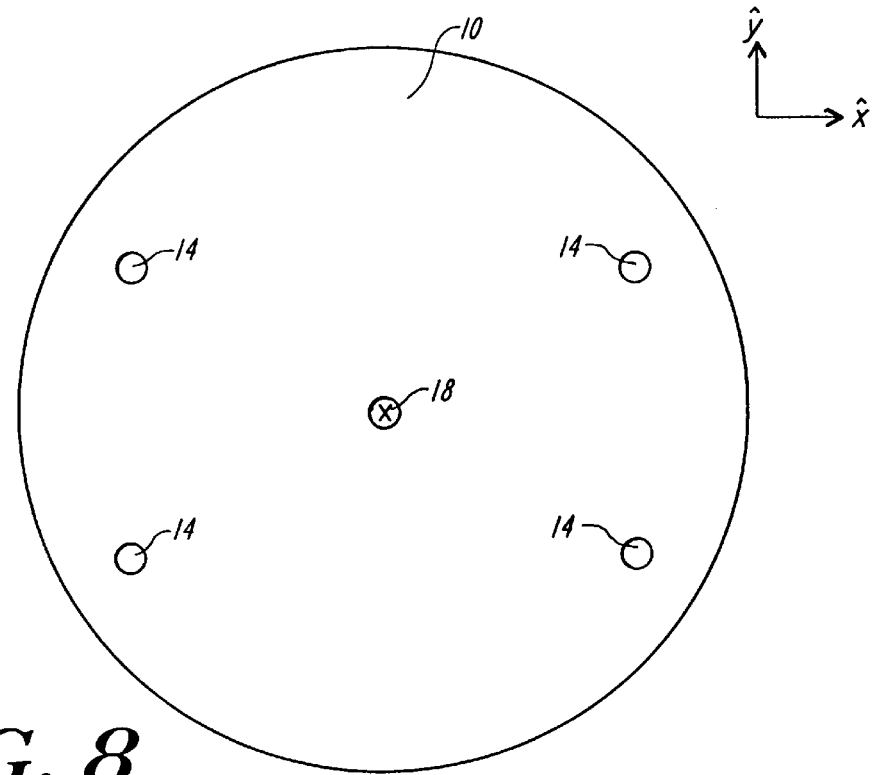
FIG. 8 is a top plan view of another alternative embodiment of a portion of the workpiece relative to the base member 24 supporting apparatus shown in FIG. 1.

With reference to FIG. 8, another alternative embodiment of a workpiece supporting apparatus according to the present invention includes more than three workpiece contact elements 14. In the illustrated embodiment, the workpiece supporting apparatus includes four workpiece contact elements and one centered compliant stiction support 18. The invention contemplates any useful number, combination, and placement of workpiece contact elements and compliant stiction supports. More contact elements and stiction supports can be advantageous when processing a relatively large workpiece. Again, most preferably, the workpiece contact elements 14 in aggregate support approximately half the weight of the workpiece and the stiction support 18 supports approximately half the weight.

It will thus be seen that the objects set forth above, among those made apparent from the preceding description, are officially attained. Since certain changes may be made in the above constructions without departing from the scope of the invention, it is intended that all matter contained in the above description and shown in the accompanying drawings be interpreted as illustrative and not in a limiting sense. It is also to be understood that the following claims are intended to cover all generic and specific features of the invention described herein, and all statements of the scope of the invention which as a matter of language might be said to fall therebetween.

Having described the invention, what is claimed as new and secure by Letters Patent is:

1. An apparatus for supporting a workpiece in a precision processing system, said apparatus comprising
   a plurality of contact elements for supporting the workpiece, said plurality of contact elements substantially forming a plane, and
   compliant stiction support means arranged in the plane formed by said contact elements and configured for stiffly supporting the workpiece against vibrational forces for reducing workpiece vibration normal to the plane.

2. The apparatus of claim 1, said apparatus further comprising
   a base member supporting each of said plurality of contact elements and said compliant stiction support means.

3. The apparatus of claim 2 wherein said compliant stiction support means comprises
   slider means for contacting said workpiece, said slider means being in sliding, frictional connection with said base member.

4. The apparatus of claim 3, wherein said compliant stiction support means further comprises
   contact spring for resiliently urging said slider means into contact with the workpiece.

5. The apparatus of claim 4, wherein said contact spring provides a force not greater than the force necessary to support the weight of the workpiece, when said contact elements support the workpiece.

6. The apparatus of claim 4 wherein said compliant stiction support means further comprises
   stiction spring means in contact with said slider means, said stiction spring means for resiliently urging said slider means into frictional contact with said base member.

7. The apparatus of claim 6, wherein the stiction spring means in operation provides a force on the slider means substantially equal to the force provided by the contact spring on the slider means.

8. The apparatus of claim 6 wherein the coefficient of static friction between said slider means and said base member is in the range substantially between 0.2 and 0.6.

9. The apparatus of claim 4, wherein said contact spring provides a force not substantially greater than the force necessary to support half the weight of the, when said workpiece contact elements support the workpiece.

10. The apparatus of claim 1, further comprising
    a plurality of said compliant stiction support means mounted with said contact elements and arranged for stiffly supporting the workpiece against vibrational forces for reducing workpiece vibration normal to the plane.

11. An apparatus for supporting a workpiece in a precision processing system, said apparatus comprising
- a base member,
- a plurality of contact elements for supporting the workpiece substantially in a plane, said contact elements being connected to said base member, and
- compliant stiction support means for stiffly supporting the workpiece against vibrational forces for reducing workpiece vibration, said compliant stiction support means being connected to said base member and located substantially in the plane formed by said plurality of contact elements, said compliant stiction support means including
  - a slider means for contacting said workpiece, said slider means being in sliding, frictional connection with said base member,
  - contact spring means for resiliently urging said slider means into contact with said workpiece, and
  - stiction spring means in contact with said slider means, said stiction spring means resiliently urging said slider means into frictional contact with said base member.

12. An apparatus for processing a workpiece having a surface at a selected location, said apparatus comprising
- a base member,
- a set of one or more workpiece contact elements mounted on said base member, each workpiece contact element maintaining the workpiece at a substantially fixed location relative to said base member, and
- a set of one or more compliant stiction support assemblies mounted on the base member, each compliant stiction support assembly maintaining the workpiece relative to the base member, each said compliant stiction assembly stiffly supporting the workpiece against vibrational forces for reducing workpiece vibration.

13. The apparatus of claim 12, said apparatus further comprising
- a processing tool mounted with said base member for processing a selected location of the workpiece.

14. An apparatus for processing a workpiece, comprising
- a base member, and one or more stiction supports mounted on said base member, each said stiction support having a slider element slidably engaged within a cavity having a stiction surface and each said stiction support stiffly supporting at least a fraction of the weight of the workpiece against vibrational forces for reducing workpiece vibration.

15. The apparatus of claim 14, further comprising
- a plurality of contact elements mounted on said base member and arranged to support a fraction of the weight of the workpiece.

* * * * *